(12) United States Patent
Mahowald et al.

(10) Patent No.: US 12,242,435 B2
(45) Date of Patent: *Mar. 4, 2025

(54) INTEGRATION OF MODEL EXECUTION ENGINE CONTAINERS WITH A MODEL DEVELOPMENT ENVIRONMENT

(71) Applicant: ModelOp, Inc., Chicago, IL (US)

(72) Inventors: Matthew Mahowald, Chicago, IL (US); George Kharchenko, Kyiv (UA)

(73) Assignee: ModelOp, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/244,172

(22) Filed: Sep. 8, 2023

(65) Prior Publication Data

US 2024/0134832 A1 Apr. 25, 2024
US 2024/0232148 A9 Jul. 11, 2024

Related U.S. Application Data

(63) Continuation of application No. 17/583,845, filed on Jan. 25, 2022, now Pat. No. 11,789,913, which is a continuation of application No. 16/392,362, filed on Apr. 23, 2019, now Pat. No. 11,269,820.

(60) Provisional application No. 62/683,208, filed on Jun. 11, 2018.

(51) Int. Cl.
G06F 16/21 (2019.01)
G06F 16/215 (2019.01)

(52) U.S. Cl.
CPC .......... G06F 16/212 (2019.01); G06F 16/215 (2019.01); G06F 16/217 (2019.01)

(58) Field of Classification Search
CPC ................. G06F 8/30; G06F 8/60; G06F 9/45
USPC ......................................................... 707/803
See application file for complete search history.

(56) References Cited

U.S. PATENT DOCUMENTS

| | | | |
|---|---|---|---|
| 1,169,820 A * | 2/1916 | Hennessey | B61F 5/14 384/601 |
| 7,173,100 B2 | 2/2007 | Mitsuyasu | |
| 10,262,271 B1 | 4/2019 | Doddi | |
| 10,599,460 B2 | 3/2020 | Bailey | |
| 2009/0054117 A1* | 2/2009 | Beser | A63F 13/52 463/43 |
| 2012/0095734 A1* | 4/2012 | Moll | G06F 17/11 703/2 |
| 2016/0085772 A1 | 3/2016 | Vermeulen | |
| 2016/0085891 A1 | 3/2016 | Ter | |
| 2016/0162478 A1 | 6/2016 | Blassin | |
| 2019/0361681 A1 | 11/2019 | Yao | |
| 2020/0019882 A1* | 1/2020 | Garg | G06F 21/6218 |

* cited by examiner

*Primary Examiner* — Hung T Vy
(74) *Attorney, Agent, or Firm* — Van Pelt, Yi & James LLP

(57) ABSTRACT

An analytic model generated in a data scientist model acquisition toolbench is received. An analytic model is translated using a structuring tool. An execution simulation for testing the translated analytic model is performed for executing the model in the data scientist model acquisition toolbench.

20 Claims, 9 Drawing Sheets

```
In [1]: import abcdefg as abc

In [2]: # fastscore.jupyter.init
        some_initial_variable = 123

In [3]: # fastscore.jupyter.input.0: alpha
        # fastscore.jupyter.schema.0: in_schema
        with open('data_for_alpha.csv', 'r') as f:
            alpha = pd.read_csv (f)

In [5]: # ... do fun math with the dataframe in alpha

In [11]: # fastscore.jupyter.output.1: total
         # fastscore.jupyter.schema.1: out_schema
         total = 1 + 2 + 3

In [ ]: # fastscore.jupyter.ignore
        with open ('results.csv', 'w') as f:
            total.to_csv (f)
```

FIG. 6

```
In [3]:  # fastscore.jupyter.input.0: alpha
         # fastscore.schema.0: in_schema with open('data_for_alpha.csv', 'r') as f:
             alpha = pd.read_csv (f)

In [4]:  alpha += 10

In [ ]:  # fastscore.jupyter.input.2: delta
         # fastscore.schema.2: in_schema_for_delta with open('delta.csv', 'r') as f:
             delta = pd.read_csv (f)

In [11]: # fastscore.jupyter.output.1: lots_of_numbers
         # fastscore.schema.1: out_schema
         # fastscore.jupyter.output.3: the_number_ten
         # fastscore.schema.3: number_ten_schema lots_of_numbers = alpha + delta
         the_number_ten = 10
```

FIG. 7

INTEGRATION OF MODEL EXECUTION ENGINE CONTAINERS WITH A MODEL DEVELOPMENT ENVIRONMENT

CROSS REFERENCE TO OTHER APPLICATIONS

This application is a continuation of U.S. patent application Ser. No. 17/583,845 entitled INTEGRATION OF MODEL EXECUTION ENGINE CONTAINERS WITH A MODEL DEVELOPMENT ENVIRONMENT filed Jan. 25, 2022, which is incorporated herein by reference for all purposes, which is a continuation of U.S. patent application Ser. No. 16/392,362 entitled INTEGRATION OF MODEL EXECUTION ENGINE CONTAINERS WITH A MODEL DEVELOPMENT ENVIRONMENT filed Apr. 23, 2019, now U.S. Pat. No. 11,269,820, which is incorporated herein by reference for all purposes, which claims priority to U.S. Provisional Patent Application No. 62/683,208 entitled INTEGRATION OF MODEL EXECUTION ENGINE CONTAINERS WITH A MODEL DEVELOPMENT ENVIRONMENT filed Jun. 11, 2018, which is incorporated herein by reference for all purposes.

BACKGROUND OF THE INVENTION

The use of data and analytics is becoming increasingly important for technical enterprises to widen competitive advantages in terms of scientific research and development, engineering efficiencies, and performance improvements. Efficiently implementing and leveraging such data and analytics using analytic models and navigating the patchwork of systems and languages is still a technical challenge for users.

BRIEF DESCRIPTION OF THE DRAWINGS

Various embodiments of the invention are disclosed in the following detailed description and the accompanying drawings.

FIG. 6 is an illustrative screenshot of a Jupyter Notebook Runner as an example.

FIG. 7 is an illustrative screenshot of a Jupyter Notebook Runner with a plurality of data sources.

DETAILED DESCRIPTION

Figure 1:
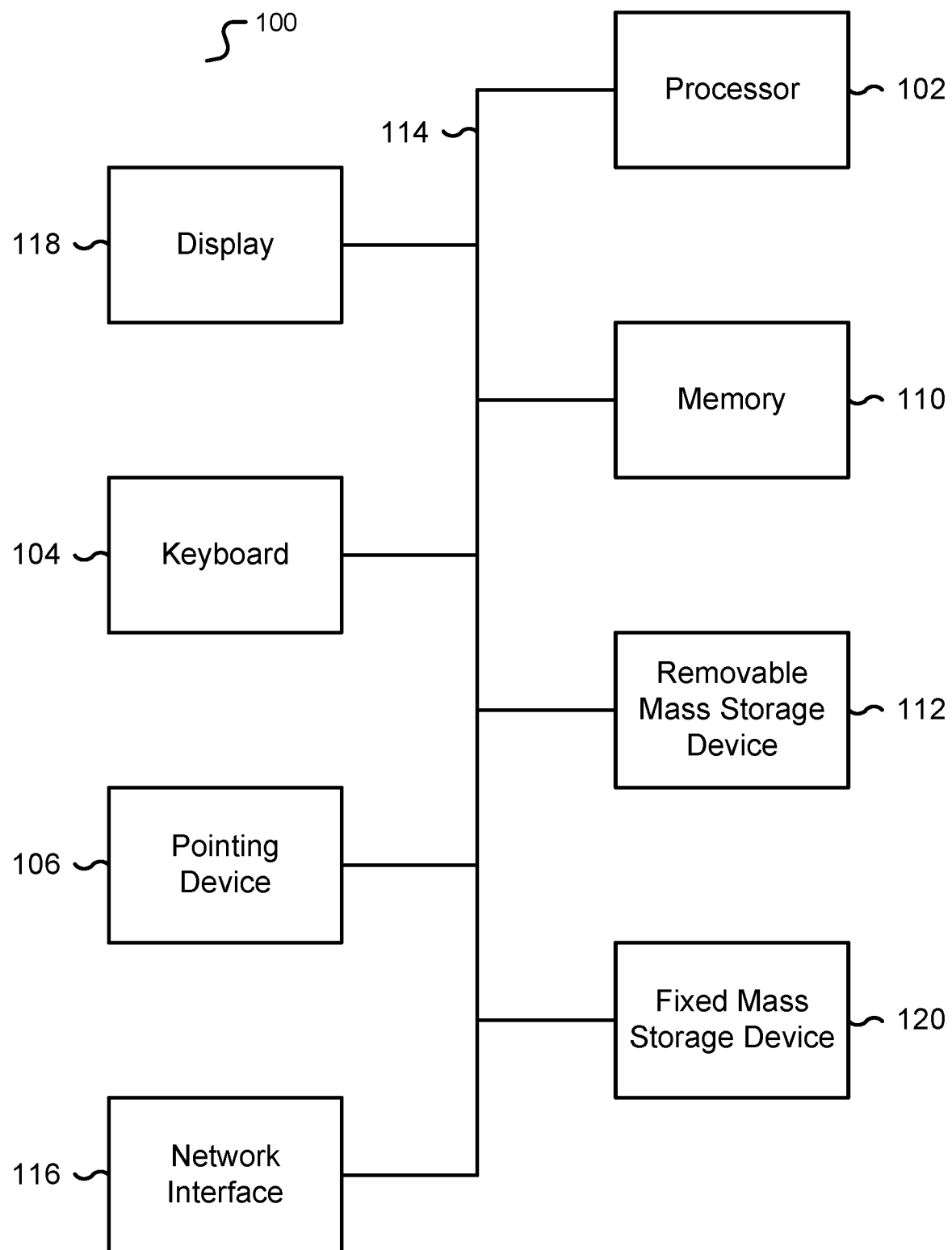
FIG. 1 is a functional diagram illustrating a programmed computer/server system for an integrated analytic model engine in accordance with some embodiments.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Integrating abstracted model execution engine containers within a model development environment is disclosed. A typical user may develop an analytic model within the domain expertise of the modeler using a data scientist model acquisition toolbench. A structuring tool and execution simulator integrated in the toolbench is disclosed. In one embodiment, the structuring tool converts/translates the analytic model, for example to abstract the model language and model execution system and/or containerizes the analytic model.

In one embodiment, the execution simulator is used to test the analytic model for executing the model in the toolbench. In one embodiment, the structuring tool and/or execution simulator are plug-ins to traditional workbench tools and/or solutions. In one embodiment, integration in a data scientist model acquisition toolbench includes instantiating code in code repositories like GitHub using hooks, storing data/artifacts in storage repositories like AWS S3 using hooks, and/or storing execution context in systems like a Docker repository or Artifactory repository using hooks.

In one embodiment, integration comprises maintaining a "cradle to grave" life cycle of an analytic model, including creation, abstraction, containment, updates, and simulation. In one embodiment, a containerized analytic model comprises the mathematical model, artifacts, and execution context. In one embodiment, a containerized analytic model is strongly typed with regards to an input schema and/or output schema. In one embodiment, GraphDB is used to track life cycle of a model. In one embodiment, a comparison tool is integrated to compare multiple models. In one embodiment, a retraining tool is integrated to retrain, for example, artifacts. In one embodiment, Local Interpretable Model-Agnostic Explanations (LIME) analysis is used to facilitate "push button" analysis for the framework.

In one embodiment, an analytic model execution engine with instrumentation for granular performance analysis for metrics and diagnostics for troubleshooting is used in integration with the toolbench. For scientific research, engineering, data mining, applied mathematical research, and/or analytics, once an analytical and/or computational model is developed for one platform, it is hard to rewrite and port into other platforms. Furthermore, it would be useful to be able to take advantage of different data streams to input into the model and to monitor performance of the model on a computer system. The analytic engine addresses these issues as well as various other technical challenges for efficiently implementing and leveraging such data and analytics for enterprises as further described below.

In one embodiment, "abstraction" as referred to herein refers to abstraction of an analytic model from its operational execution environment. A virtualized execution environment (VEE) is used to abstract the analytic model. In one embodiment, operating system-level virtualization such as a container is used for the VEE and represents an example used throughout this specification, but without limitation other virtualization levels may also be used for abstraction, including: a hardware-level virtualization such as a virtual machine (VM), application-level virtualization, workspace-level virtualization, and/or service virtualization. Container environments used may include Docker and/or LxC.

The designer of an analytic model, referred to herein as a "data science user", uses one of a number of programming languages/tools including, for example, C, Python, Java, R, S, SAS ("Statistical Analysis System"), PFA ("Portable Format for Analytics"), H2O, PMML ("Predictive Model Markup Language"), SPSS, Mathematica, Maple, and MATLAB to articulate their analytic model that may use libraries/packages such as NumPy for scientific and numeric computing, BLAST for bioinformatics, and/or TensorFlow for machine learning. Given its programming language, the data science user incorporates design rules into the analytic model to permit abstraction of their model in a disclosed execution framework. The design rules also include specifying a schema for each input and output to the model.

An analytic model consumes data, typically in the form of a stream. The provider of analytic data, referred to herein as a "devops user", uses one or more data sources including, for example, Apache Spark, Hadoop, Amazon Redshift, Azure SQL Data Warehouse, Microsoft SQL Server, and/or Teradata. The devops user also uses one or more example infrastructure systems including: on-premises hardware such as in-office computing and/or proprietary datacenter computing; and off-premises hardware such as cloud infrastructure including AWS ("Amazon Web Services), Microsoft Azure, IBM BlueMix, and/or GCP ("Google Cloud Platform"). The devops user provides an I/O descriptor for each stream to permit abstraction of the I/O stream in the disclosed execution framework. Without limitation the data science user may be the same user as the devops user.

The analytic model abstraction and I/O descriptor abstraction are used in the design of a standardized container referred to herein as an "engine" to permit analytic models to be deployed/operationalized with their associated streams. In one embodiment, a containerized design approach is used for the engine container and its associated support containers such as a model connector, model manager, and dashboard with each container providing a web service using an API, for example a RESTful API, to provide independently executable microservices. The approach provides a clean abstraction to the analytic design process and a clean abstraction to the data engineering and feeds. The container abstraction itself shares the advantages of containerized environments such as the Docker ecosystem, scaling, cloud ecosystems, and flexibility using RESTful APIs.

These abstractions divide and conquer analytics organizations to provide a novel type of user, referred to herein as an "analytic ops" specialist and/or user, with the ability to deploy/operationalize an analytic model independent of the language of articulation, the data/streams on which it executes over, and the systems on which it runs. Data science users and quants focus on algorithm and model design with systems to explore and create algorithms until they have a model conforming to design rules for a model abstraction. Devops users such as dataops, data engineering, and/or IT specialization focus on establishing and maintaining feeds, operational data, and/or historical data streams for a stream abstraction. Devops users also build and/or maintain the on-premises and off-premises/cloud infrastructure for a container abstraction. Thus, the disclosed techniques allow the analytic ops user to be free to focus on tuning and deployment of any analytic model with true language neutrality under any infrastructure and with any data stream with true data neutrality, without requiring a deep understanding of data science, production data, and/or infrastructure.

The container, model, and stream abstraction approach addresses predictive analytics deployment challenges:
  a. IT teams find it challenging to manually recode analytic models;
  b. Complex, for example machine learning, analytic models are hard to deploy;
  c. Updating production analytic models is too slow of a process;
  d. It is challenging to support many analytic model languages, for example SAS, R, and Python;
  e. Data Science and IT teams find it challenging to work together as they belong to different disciplines with different backgrounds, strengths, weaknesses, and/or perspectives; and
  f. It is hard to scale scoring across enterprise data.

A dynamically configurable microservice model for data analysis using sensors may be used. Data analytics often uses high performance profiling/tuning to provide efficient processing of data. Sensors are a programming object used to provide profiling for the analytic model and/or streams, and may be associated with metrics/tools for monitoring, testing, statistically analyzing and/or debugging. A sensor may include: a code point related to the engine structure such as a model runner, input port, or output port; a sampling frequency; and/or a reporting frequency. Using an API such as a RESTful API a sensor may be added at run-time, dynamically configured at run-time, and/or removed at run-time. Dynamic configuration of a sensor includes reconfiguration a sensor parameter and/or threshold.

The engine and any container and/or VEE may be dynamically configured at run-time using an interface such as a RESTful API. Dynamic configuration of an engine includes changing a stream, an analytic model, an included library, and/or a cloud execution environment. The RESTful API may be used directly, via an SDK, via a CLI ("command line interface"), and/or via a GUI ("graphical user interface") such as a dashboard.

Applications for a dynamically configurable microservice analytic model include, for example, being able to run-time compare different stream sources, different streams, different languages for a given analytic model, and different analytic models in a champion/challenger style. Applications for dynamically configurable sensors include run-time debugging and/or run-time profiling until the engine is optimized, followed by run-time optimization by dynamically removing sensors for increased performance.

FIG. 1 is a functional diagram illustrating a programmed computer/server system for an integrated analytic model engine in accordance with some embodiments. As shown, FIG. 1 provides a functional diagram of a general purpose computer system programmed to provide an analytic model engine in accordance with some embodiments. As will be apparent, other computer system architectures and configurations can be used for an integrated analytic model engine.

Computer system 100, which includes various subsystems as described below, includes at least one microprocessor subsystem, also referred to as a processor or a central processing unit ("CPU") 102. For example, processor 102 can be implemented by a single-chip processor or by multiple cores and/or processors. In some embodiments, processor 102 is a general purpose digital processor that controls the operation of the computer system 100. Using instructions retrieved from memory 110, the processor 102 controls the reception and manipulation of input data, and the output and display of data on output devices, for example display and graphics processing unit (GPU) 118.

Processor 102 is coupled bi-directionally with memory 110, which can include a first primary storage, typically a random-access memory ("RAM"), and a second primary storage area, typically a read-only memory ("ROM"). As is well known in the art, primary storage can be used as a general storage area and as scratch-pad memory, and can also be used to store input data and processed data. Primary storage can also store programming instructions and data, in the form of data objects and text objects, in addition to other data and instructions for processes operating on processor 102. Also as well known in the art, primary storage typically includes basic operating instructions, program code, data and objects used by the processor 102 to perform its functions, for example programmed instructions. For example, primary storage devices 110 can include any suitable computer-readable storage media, described below, depending on whether, for example, data access needs to be bi-directional or uni-directional. For example, processor 102 can also directly and very rapidly retrieve and store frequently needed data in a cache memory, not shown. The processor 102 may also include a coprocessor (not shown) as a supplemental processing component to aid the processor and/or memory 110.

A removable mass storage device 112 provides additional data storage capacity for the computer system 100, and is coupled either bi-directionally (read/write) or uni-directionally (read only) to processor 102. For example, storage 112 can also include computer-readable media such as flash memory, portable mass storage devices, holographic storage devices, magnetic devices, magneto-optical devices, optical devices, and other storage devices. A fixed mass storage 120 can also, for example, provide additional data storage capacity. One example of mass storage 120 is an eMMC or microSD device. In one embodiment, mass storage 120 is a solid-state drive connected by a bus 114. Mass storage 112, 120 generally store additional programming instructions, data, and the like that typically are not in active use by the processor 102. It will be appreciated that the information retained within mass storage 112, 120 can be incorporated, if needed, in standard fashion as part of primary storage 110, for example RAM, as virtual memory.

In addition to providing processor 102 access to storage subsystems, bus 114 can be used to provide access to other subsystems and devices as well. As shown, these can include a display monitor 118, a communication interface 116, a touch (or physical) keyboard 104, and one or more auxiliary input/output devices 106 including an audio interface, a sound card, microphone, audio port, audio recording device, audio card, speakers, a touch (or pointing) device, and/or other subsystems as needed. Besides a touch screen and/or capacitive touch interface, the auxiliary device 106 can be a mouse, stylus, track ball, or tablet, and is useful for interacting with a graphical user interface.

The communication interface 116 allows processor 102 to be coupled to another computer, computer network, or telecommunications network using a network connection as shown. For example, through the communication interface 116, the processor 102 can receive information, for example data objects or program instructions, from another network, or output information to another network in the course of performing method/process steps. Information, often represented as a sequence of instructions to be executed on a processor, can be received from and outputted to another network. An interface card or similar device and appropriate software implemented by, for example executed/performed on, processor 102 can be used to connect the computer system 100 to an external network and transfer data according to standard protocols. For example, various process embodiments disclosed herein can be executed on processor 102, or can be performed across a network such as the Internet, intranet networks, or local area networks, in conjunction with a remote processor that shares a portion of the processing. Throughout this specification "network" refers to any interconnection between computer components including the Internet, Bluetooth, WiFi, 3G, 4G, 4GLTE, GSM, Ethernet, TCP/IP, intranet, local-area network ("LAN"), home-area network ("HAN"), serial connection, parallel connection, wide-area network ("WAN"), Fibre Channel, PCI/PCI-X, AGP, VLbus, PCI Express, Expresscard, Infiniband, ACCESS.bus, Wireless LAN, HomePNA, Optical Fibre, G.hn, infrared network, satellite network, microwave network, cellular network, virtual private network ("VPN"), Universal Serial Bus ("USB"), FireWire, Serial ATA, 1-Wire, UNI/O, or any form of connecting homogenous, heterogeneous systems and/or groups of systems together. Additional mass storage devices, not shown, can also be connected to processor 102 through communication interface 116.

An auxiliary I/O device interface, not shown, can be used in conjunction with computer system 100. The auxiliary I/O device interface can include general and customized interfaces that allow the processor 102 to send and, more typically, receive data from other devices such as microphones, touch-sensitive displays, transducer card readers, tape readers, voice or handwriting recognizers, biometrics readers, cameras, portable mass storage devices, and other computers.

In addition, various embodiments disclosed herein further relate to computer storage products with a computer readable medium that includes program code for performing various computer-implemented operations. The computer-readable medium is any data storage device that can store data which can thereafter be read by a computer system. Examples of computer-readable media include, but are not limited to, all the media mentioned above: flash media such as NAND flash, eMMC, SD, compact flash; magnetic media such as hard disks, floppy disks, and magnetic tape; optical media such as CD-ROM disks; magneto-optical media such as optical disks; and specially configured hardware devices such as application-specific integrated circuits ("ASIC"s), programmable logic devices ("PLD"s), and ROM and RAM devices. Examples of program code include both machine code, as produced, for example, by a compiler, or files containing higher level code, for example a script, that can be executed using an interpreter.

The computer/server system shown in FIG. 1 is but an example of a computer system suitable for use with the various embodiments disclosed herein. Other computer systems suitable for such use can include additional or fewer subsystems. In addition, bus 114 is illustrative of any interconnection scheme serving to link the subsystems. Other computer architectures having different configurations of subsystems may also be utilized.

Figure 2A:
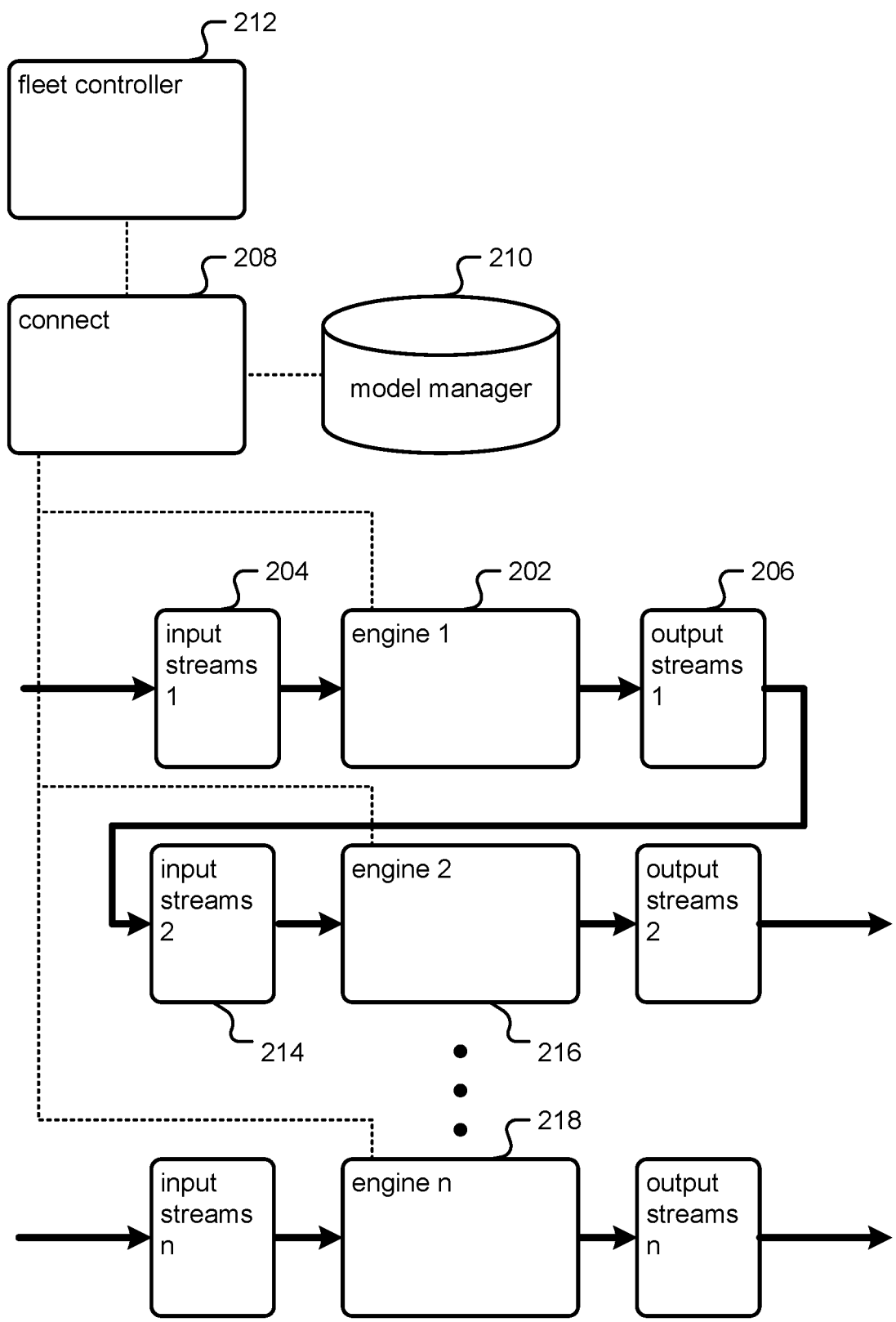
FIG. 2A is a block diagram illustrating an embodiment of an analytic model engine system.

FIG. 2A is a block diagram illustrating an embodiment of an analytic model engine system. Some of the blocks shown in FIG. 2A are virtualized execution environments, for example Docker containers, hosted by one or more computer/server systems in FIG. 1 on premises or in a cloud infrastructure. In one embodiment, an engine (202) is a container comprising an analytic model and providing a portable and independently executable microservice, for example via a web service with RESTful API. The engine (202) is coupled to an input stream (204) for data input and an output stream (206) for data output including scoring the analytic model based on the data input.

The engine (202) is coupled to a connect container (208), which provides discovery service for the engine (202) and other containers, for example to establish a system of determining the IP address of the engine (202) for contact via the RESTful API. In one embodiment, connect (208) is a service discovery component with a proprietary implementation, but may be replaced by any other OTS service discovery services, for example Netflix Eureka, without materially affecting the rest of the microservices. The connect container (208) is coupled to a model manager database (210) to store abstractions as static descriptions comprising: models, schemas, I/O descriptors, sensors, model environment abstractions, engine environment abstractions, and/or model I/O tests. These descriptions are referred to herein as "static" in the sense that they are a configuration bound to a file prior to or during run-time. The connect container (208) is also coupled to a fleet controller container (212) that binds a description in the model manager (210) to run-time abstractions in the engines (202) and orchestrates communication between users and engines and between engines, for example via an SDK ("software development kit"), a CLI, and/or a dashboard GUI.

Utilizing the fleet controller (212), model manager (210) and/or connect (208) containers, a pipeline of engines may be established, here shown to connect the output stream of the engine (206) to an input stream (214) of a second engine (216). Within the system of FIG. 2A as many engines may be statically designed or dynamically spun up, and given the interoperable and ubiquity of containers, for example Docker containers, in cloud computing virtually an unlimited number of engines may be used, here shown up to an nth engine (218).

Figure 2B:
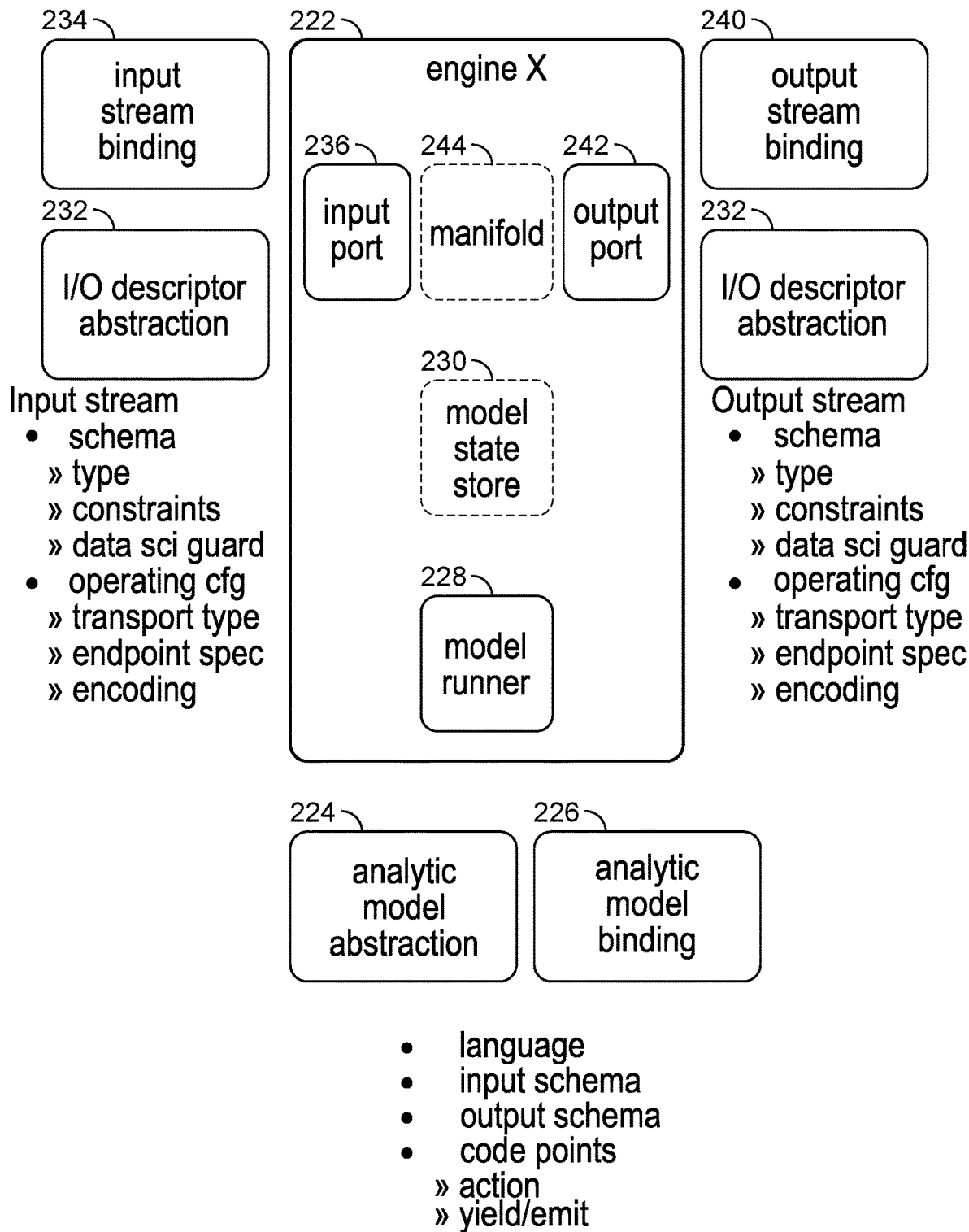
FIG. 2B is a block diagram illustrating an embodiment of an analytic model engine.

FIG. 2B is a block diagram illustrating an embodiment of an analytic model engine. In one embodiment, the system of FIG. 2B is represented by engines (202), (216), (218) in FIG. 2A. In one embodiment, the engine is a Docker container, but without limitation any other VEE may be used, for example a VMWare virtual machine.

Engine (222) is associated with an analytic model. An analytic model abstraction (224) is used to abstract a given analytic model, comprising:
 a. The model's programming language, for example, Java, Python, C, or R;
 b. One or more input schema for the model, wherein the input schema comprises: one or more data types, constraints, and data science guards. In one embodiment, a schema is language neutral and may be expressed in a declarative language and/or execution neutral language such as JSON, XML, and/or Avro. This schema may include a specification for: a data type such as integer, float, and/or Boolean; constraints such as non-negative values and/or positive values; and data science guards such as a specification of a probability distribution and/or a standard deviation with tolerances.
 c. One or more output schema for the model, wherein the output schema comprises: one or more data types, constraints, and data science guards; and
 d. Language specific execution code points, wherein the code points at a minimum comprise: an action to start scoring and/or computing; and a yield/emit to start outputting score results. This includes specifying an appropriate/language-specific code point for execution referred to herein as an "action". Examples of an action include the main( ) loop in C, the code between the keyword action and keywords yield/emit in R, and so forth.

For the given analytic model (226) bound to the abstraction (224), allocation is made within the container (222) for a model runner (228) responsible for providing an execution environment for the language specified by the model (226) in its abstraction (224) and/or an inspection of the model (226). For example, if the language is C, the model runner (228) may include appropriate C libraries and dependencies for code execution, and if the language is Python, the model runner (228) may include the Python 2 or Python 3 interpreter with the appropriate Python packages. Allocation is also made for model state store (230) within container (222) based on inspection of the model (226).

Engine (222) is associated with one or more input streams. An I/O descriptor abstraction (232) is used to abstract a given input stream, comprising:
 a. A schema, comprising: one or more data types, constraints, and data science guards; and
 b. An operating configuration, comprising: a transport type, one or more endpoint specifics, and an encoding. One example would be a transport type of a file in a filesystem, an endpoint specific being a file descriptor, and an encoding being JSON. Another example would be a transport type of a Kafka stream, an endpoint specific being a Kafka bootstrap server configuration, and an encoding being AVRO binary.

The abstraction (232) is bound to an input stream (234) and coupled to an appropriate input port (236) in the engine (222). Likewise an output is associated with another I/O descriptor abstraction (232), bound to an output stream (240), and coupled to an appropriate output port (242) in the engine (222). One or more internal/hidden blocks such as a manifold (244) may provide services comprising:
 a. a schema checker to compare the input schema from the analytic model abstraction (224) which may be provided by a data science user with the input I/O descriptor abstraction (232) which may be provided by a devops user; and
 b. serializiation and deserialization and/or encode/unencode a stream (234), (240), for example to deserialize for a Python object.

In this embodiment, the engine (222) has two primary functions: first, it binds an analytic model (226) to an abstraction (224) and streams (234), (240) to an I/O descriptor abstraction (232) using a consistency check on the appropriate input and output schemas in any order of binding; second, it executes the model by invoking the model runner (228).

Figure 2C:
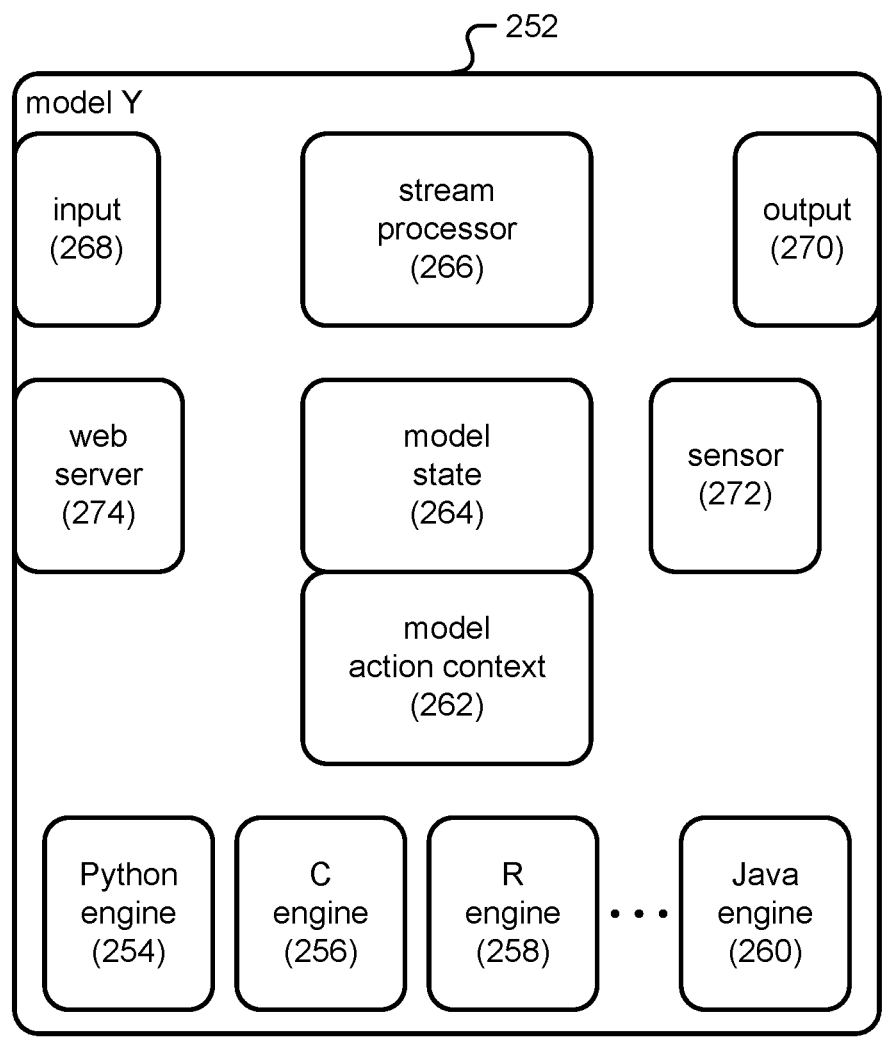
FIG. 2C is a block diagram illustrating an embodiment of an analytic model binding.

FIG. 2C is a block diagram illustrating an embodiment of an analytic model binding. In one embodiment, the system of FIG. 2C is represented by model binding (226) in FIG. 2B and execution is served by model runner (228) in FIG. 2B. After the data science follows the design rules in crafting the analytic model algorithm in a specific programming language and binds it to abstraction (224), the system interprets the code, inspecting the model code for code snippets that are associated with, for example: action, emit/yield, whether state is saved externally, concurrency flags, and whether state is shared. After the model execution framework is interpreted and/or inspected, the system generates a VEE such as a Docker container for the analytic engine (222) to include executable code (252) to implement the analytic model as shown in FIG. 2C.

Language specific engines comprising compilers/interpreters, toolchains, debuggers, profilers, development environments, libraries and/or dependencies are instantiated to permit a flexible selection of programming languages including Python (254), C (256), R (258), and Java (260), and an ellipses is used in FIG. 2C to indicate there may be other languages not shown in FIG. 2C such as PFA, MATLAB, and SAS.

In FIG. 2C the analytic model code itself to be executed is referred to herein as the model action context (262) and an associated model state (264) is used consistent with the above inspection/interpretation of state initialization and state management. Stream processor (266) is a component that may perform serialization and deserialization of input data (268) and output data (270). Stream processor (266) may comprise drivers for different data sources and for different output destinations. Stream processor (266) may provide data type safety mechanisms like a computer science guard to enforce/flag data typing such as integers, constraints. Stream processor (266) may provide data science guards to enforce/flag statistical properties such as standard deviation.

The model (252) may include one or more sensors (272), components that debug and/or profile the model. A sensor may allow a user to instrument, for example, how much memory is being used in the action context (262), how much memory is being used in the stream processor (266), how many CPU cycles are being used by math in the action context (262), how many CPU cycles are being used serializing a data stream (266), how many CPU cycles are being used deserializing a data stream (266), and so on. For example, a sensor may facilitate continuous tuning. A sensor may be dynamically configurable such that they may be added, activated, reconfigured, deactivated, and/or removed at run-time via an API, for example an RESTful API.

An example of a sensor (272) for engine instrumentation comprises a description of: what to measure; sampling intervals; and output intervals, for example:

```
{
    "Tap": "sys.memory",
    "Activate": {
        "Type": "regular",
        "Interval": 0.5
    },
    "Report": {
        "Interval": 3.0
    }
}
```

The model (252) may include a web server (274), providing microservices over HTTP via an API, for example a RESTful API. The system in FIG. 2A, FIG. 2B, and FIG. 2C may in one embodiment have a standard API and/or RESTful API to allow a consistent programmatic approach to interfacing with various components in the system.

Figure 3:
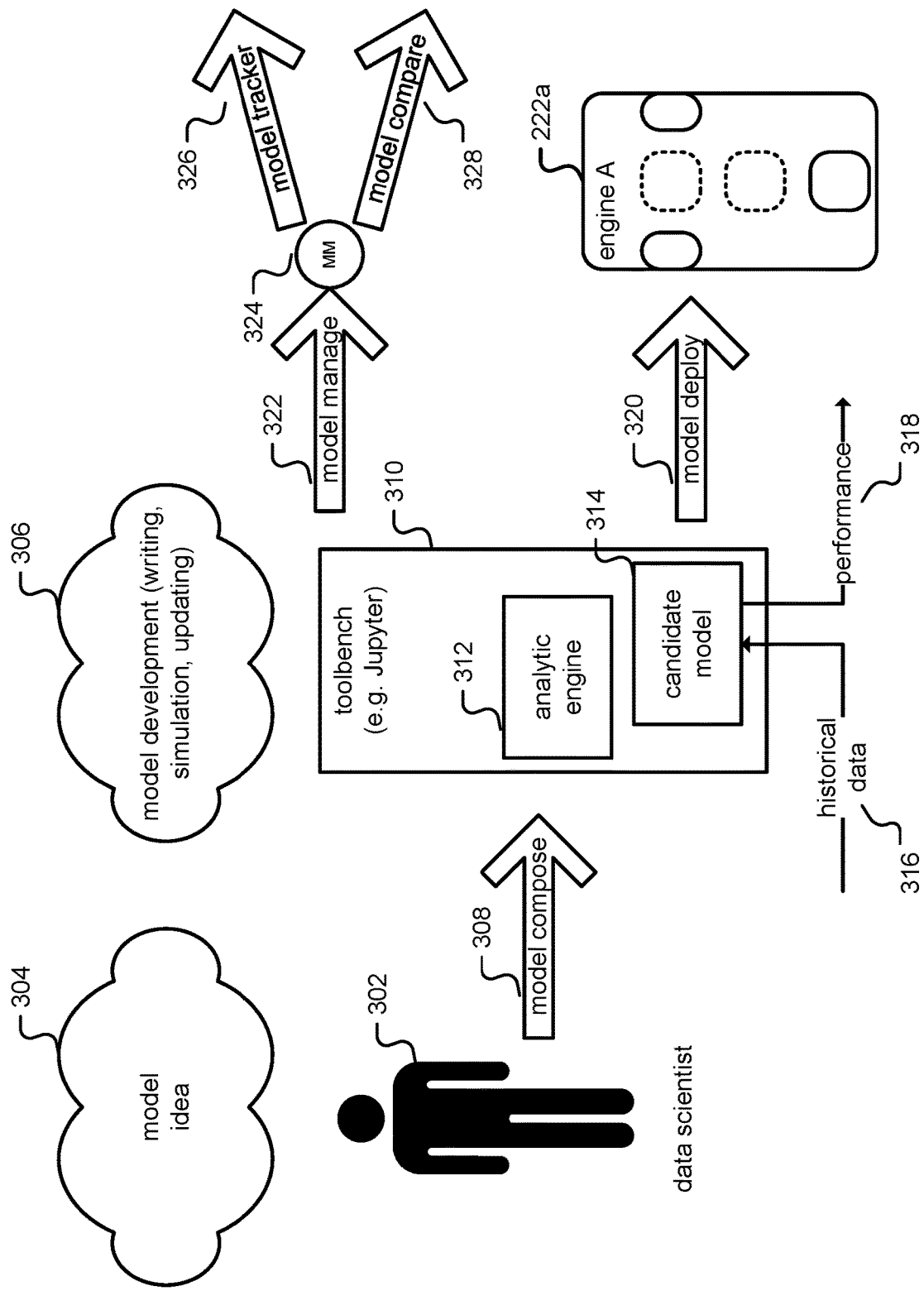
FIG. 3 is a block diagram illustrating an embodiment of a system for integrating a data scientist model acquisition toolbench.

FIG. 3 is a block diagram illustrating an embodiment of a system for integrating a data scientist model acquisition toolbench. In one embodiment, the system of FIG. 3 is carried out by the computer of FIG. 1.

Data scientist user (302) has an idea for an analytic model (304) and begins to receive/develop the model (306) and/or compose a model (308), using for example a dedicated tool (not shown) or using a traditional data scientist acquisition toolbench (310). This process includes writing the model, simulating the model, and/or updating the model. An example of a toolbench includes Jupyter, Rstudio, Anaconda, Hadoop, Cloudera, SAS, Zeppelin, Rodeo, and Beaker Notebook.

Systems to integrate within the toolbench include an analytic engine (312) by way of a plug-in, for example. A candidate model (314) can then be written, trained, and execution simulated with historical data (316) and performance (318) output for analysis. After the model has been initially developed a model deploy (320) flow may be used to translate the analytic model by way of a structuring tool for example. The translated model may be containerized into a sample engine (222a) as described above.

Models (314) may also follow a lifecycle management model manage (322) flow to a model manager (324), to allow a model tracker (326) flow with regards to tracking lifecycle metadata such as data trained on, engine and model changes, and deployment. The model manager (324) may also facilitate model a compare (328) flow to compare models together in a "bake-off" head to head fashion, or other comparisons. The model manager (324) may coordinate a "hook" which as referred to herein is any code extension, plug-in, module, interface, API, or other interconnection to other systems such as a Git hook, AWS S3 hook, Docker repository hook, and/or Artifactory hook. The model manager (324) may also perform version control.

Model tracker (326) may include using GraphDB or another graph database to keep track of lifecycle data such as what scores were created from what data over a model's life cycle, when a model was retrained, and so on. Another part of model tracker (326) may include LIME analysis used to facilitate "push button" analysis for the framework, in part doing a local search along a linear model analogous to a "derivative" of a neural network.

Figure 4:
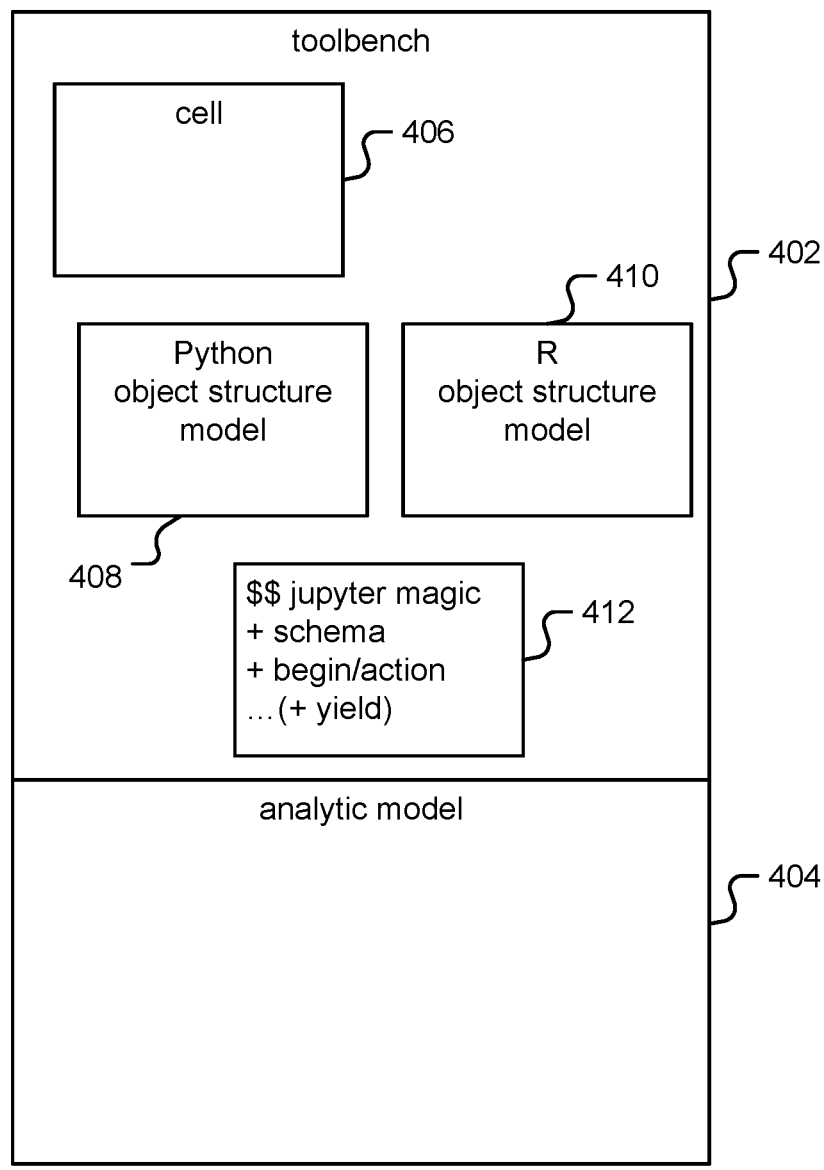
FIG. 4 is a block diagram illustrating an embodiment of an integrated data scientist model acquisition toolbench.

FIG. 4 is a block diagram illustrating an embodiment of an integrated data scientist model acquisition toolbench. In one embodiment, the system of FIG. 4 is depicted in FIG. 3 part (310). Without limitation, a Jupyter toolbench is depicted in FIG. 4 but any person of ordinary skill in the art understands another toolbench like Zeppelin may be similarly integrated.

Toolbench (402) for analytic model (404) includes a cell (406), analogous to a terminal window to the model and schema composing. For each language supported there is an object structure model, with Python (408) and R (410) shown in FIG. 4. The object structure model is a compiled piece of code that is a library to provide the abstraction, structural, and simulation aspects of integration.

The object structure model (408, 410) may be invoked using Jupyter magic bindings (412), shown in FIG. 4 with examples regarding schema, begin/action directives, and optionally a yield directive.

Figure 5:
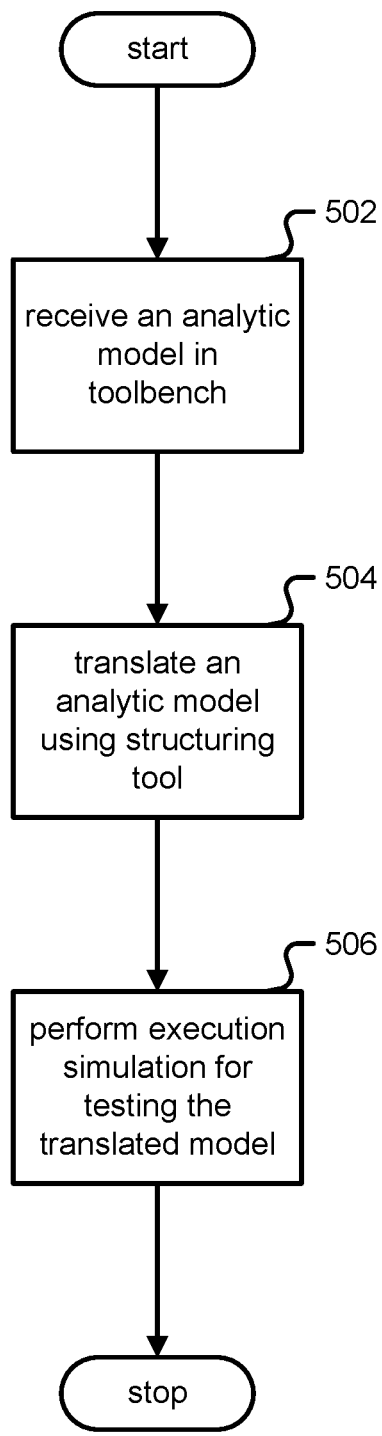
FIG. 5 is a flowchart illustrating an embodiment of a process for integrating a data scientist model acquisition toolbench.

FIG. 5 is a flowchart illustrating an embodiment of a process for integrating a data scientist model acquisition toolbench. In one embodiment, the process of FIG. 5 is carried about by the system in FIG. 1 and/or FIG. 4.

In step 502, an analytic model is received. In one embodiment, the received model is received in a toolbench and/or generated in a data scientist model acquisition toolbench. In one embodiment, the data scientist model acquisition toolbench comprises at least one of the following: Jupyter, Rstudio, Zeppelin, Cloudera, and Data Science Toolbench.

In step 504, an analytic model is translated using a structuring tool. In one embodiment, the structuring tool is integrated into the data scientist model acquisition toolbench. In one embodiment, translating comprises an object-based abstraction of the analytic model. In one embodiment, the analytic model is written in at least one of the following: C, Python, Java, R, S, SAS, PFA, H2O, PMML, SPSS, and MATLAB.

In step 506, an execution simulation is performed for testing the translated analytic model for executing the model in the data scientist model acquisition toolbench. In one embodiment, the execution simulator is integrated into the data scientist model acquisition toolbench.

After step 506, in an optional step not shown in FIG. 5, the translated analytic model is exported for deployment in a production execution environment, for example to a virtualized execution environment for an analytic engine. In one embodiment, the toolbench publishes to export the analytic model to a model manager. In one embodiment, the toolbench publishes to export the analytic model to a model tracker, to perform model life cycle tracking. Performing model life cycle tracking may include using a graph database for tracking any changes to the model from development through deployment life cycle.

In one embodiment, model deploy tools are integrated into the data scientist model acquisition toolbench. In one embodiment, a plug-in for a second data scientist model acquisition toolbench is supported. In one embodiment, the integrated data scientist model acquisition toolbench comprises tools for at least one of the following: execution simulation, automatic schema generation, structuring, and test.

Examples

In the following examples, without limitation the abstraction mechanism is called FastScore and the toolbench used is Jupyter, but any person of ordinary skill in the art understands these examples are for illustrative purposes and may be generalized for any abstraction and/or toolbench.

Jupyter Integration. As described above, Jupyter is a popular tool among data scientists and other users of Python and R for building models. It is an evolution of the IPython project, and provides a Notebook interface similar to that of Mathematica or SAGE.

The Jupyter Notebook server is also available as a Docker container. A high-level FastScore SDK is built on top of the FastScore CLI, so that users can interact with FastScore from within their R or Python scripts. The "Model Deploy" service is a customized derivative of the Jupyter Notebook server that comes with these tools already pre-installed, and the tools are also be available to use outside of Jupyter.

These tools perform the following:

To make it easy to build a FastScore-ready model using a user's existing tools;

Related to the above, to make it easy to figure out why the model a user wrote is not working in FastScore; and To enable users to interact with FastScore from within their Python or R applications.

The guiding philosophy of Jupyter integration is that the user learn as few new commands or syntax as possible, error messages are descriptive and helpful, and that it is easy to build new applications on top of these tools.

To begin, a user starts a new Jupyter notebook with a Python kernel to start building a model. Step 1 is to get started with the toolset by importing the Jupyter notebook magic:

from fastscore_tools import ipmagic

Step 2 is defining the input and output schema variables:

```
sch_in = '{"type":"array", "items":"double"}'
sch_out = '"double"'
``` as these are strings to be cast to Avro schema types using Titus.

Step 3 is to define a model. The "%%model_def" cell magic command is defined by by fastscore_tools.ipmagic, and parses the code into a Model object:

```
%%model_def
# fastscore.input:   sch_in
# fastscore.output:  sch_out import numpy as np
def begin( ):
    print 'Hello World!'
def action(datum):
    yield udf(datum)
def udf(datum):
    return np.dot(datum, datum)
```

Note that import statements and user-defined functions may be included. Example output may be:

```
Model loaded, and bound to the '_model' global variable.
<fastscore_tools.model.Model at 0x7f93b60ade50>
```

Step 4 is that the "%%model_def" cell magic also executes the code in the cell, so the user may now call the action function independently (output shown in italics):

```
action([1.0, 2.0]).next( )
5.0
```

Or equivalently:

```
_model.action([1.0, 2.0]).next( )
5.0
```

Step 5 is rebinding the model's action method to a new function:

```
def action(datum):
    yield udf(datum) + 2.0
_model.action = action
_model.action([1, 2]).next( )
7.0
```

Step 6 is simulating a scoring run, which may be called the model's "score" method:

```
_model.score(['[1.0, 2.0]','[3.0, 4.0]'], use_json=True)
Hello World!
['7.0' , '27.0']
```

Note that if use_json is set to True (default is False), the inputs are deserialized from JSON strings, and then outputs are serialized into JSON. Additionally, in contrast to _model.action( ), score executes the begin( ) and end( ) methods of the model as well, unless it is called with complete=False.

Step 7 is to validate that the model produces the output wanted from test inputs:

```
_model.validate(inputs=['[1.0, "2.0"]', '[3.0, 4.0]'],
    outputs=['7.0', '27.0'], use_json=True)
    Invalid Input: Expecting type {"items": "double", "type":
    "array"}, found [1.0, "2.0"]
    False
```

As may be seen in the output, there is a typographical error in input as there should not be any quotation marks around the "2.0" input. Fixing this:

```
_model.validate(inputs=['[1.0, 2.0]', '[3.0, 4.0]'],
    outputs=['7.0', '27.0'], use_json=True)
    Hello World!
    True
```

With the model now working, the model may be reviewed before exporting it to FastScore:

```
print_model.export_to_string( )
# fastscore.input: sch_in
# fastscore.output: sch_out
import numpy as np
def action(datum):
    yield udf(datum) + 2.0
def begin( ):
    print 'Hello World!'
def udf(datum):
    return np.dot(datum, datum)
```

Loading to FastScore. As the user is happy with the model built, it is loaded into FastScore and checked.

```
from fastscore_tools import connect, deploy, score
connect('https://localhost:8000')
FastScore Proxy prefix set.
```

This is an alias for fastscore.connect from the FastScore CLI.

To deploy the model:

```
deploy(_model)
Model deployed and ready to score.
```

This loads the model, and generates dummy stream descriptors with the specified schema that utilize the REST transport for scoring. Options may be used to specify other stream transports. The input and output schema are also uploaded.

To score some data:

```
score([[1.0, 2.0], [3.0, 4.0]])
[7.0, 27.0]
```

At this step each input to the score method is serialized to JSON using the model's input schema, passed to the running model in FastScore via the REST API call/job/input, and then returned and deserialized back into a Python object for later manipulation.

Note that along with a philosophy that "it should be easy for a user to build on top of this", everything described above is also possible to do in a generic Python script outside of Jupyter. Instead of using Jupyter magic like the %%model_def magic the user may use:

```
from fastscore_tools.model import Model
my_model1 = Model.from_string('# fastscore.input: sch_in\n . .
.')
my_model2 = Model(action=action, schemata=my_schemata,
    begin=begin, end=end, functions=[udf1, udf2, udf3],
    imports=['import numpy as np'])
```

Thus, it is possible for a user to build an automated model validation and deployment harness instead.

Jupyter Notebook Runner. In one embodiment, a Jupyter notebook is made runnable both via Jupyter itself and via a FastScore engine. This is performed while requiring as few changes to the notebook as possible—that is, starting with a notebook that has been reasonably factored into cells that deal with pulling in support libraries, reading input, math calculations, and then finally output. A few "smart comments" supply the FastScore Jupyter Notebook Runner with information it needs to properly run the notebook. The notebook still runs correctly even in the presence of the various smart comments.

FIG. 6 is an illustrative screenshot of a Jupyter Notebook Runner as an example. Cell [1] of FIG. 6 shows a simple import of a library. This may work the same as if FastScore were running a normal Python model. Cell [2] of FIG. 6 shows a #fastscore.jupyter.init smart comment indicating that the code inside this cell should only be executed once, when the model is loaded for the first time.

Cell [3] of FIG. 6 shows the start of the main process. The #fastscore.jupyter.input.0: alpha smart comment tells FastScore that 'alpha' is the name of the variable that should be loaded up with a dataframe received via the stream descriptor loaded up on slot 0. The #fastscore.schema.0: in_schema smart comment tells FastScore which schema against which to validate the incoming data.

Note that actual Python code in this cell may not be executed. For example, the notebook has been 'reasonably factored'. This cell only loads a single variable with data from a file, so that FastScore may replace the cell, in its entirety, with reading data via a stream descriptor and loading it into the specified variable.

Cell [5] of FIG. 6 is a sample cell without a smart comment. Cells that contain no 'smart' comments execute normally. Multiple such cells are executed in succession as though they were part of the 'action' function in a normal Python model.

Cell of FIG. 6 shows an output smart comment. The #fastscore.jupyter.output.1: total smart comment tells FastScore that when this cell is done executing, the contents of the named variable should be emitted via the stream descriptor loaded up in slot 1. The #fastscore.schema.1: out_schema smart comment tells FastScore against which schema to validate the outgoing data. The Python code in this cell may be executed, unlike in cell [3].

Cell [ ] of FIG. 6 illustrates the usage of a #fastscore.jupyter.ignore smart comment, which tells FastScore to skip this cell entirely.

FIG. 7 is an illustrative screenshot of a Jupyter Notebook Runner with a plurality of data sources. In the example shown in FIG. 7, the notebook reads in data from two different .csv files. There are two cells that contain the #fastscore.jupyter.input.X smart comment, cell[3] and cell[ ]. This is preferred over a cell that contains both. One expectation is that for each input, a separate notebook cell is created and configured with the appropriate smart comments.

In order for this notebook to run inside Jupyter, the final cell has both 'alpha' and 'delta' filled out. As such, FastScore may wait until it has read data in from each of the two inputs before executing the equivalent of the 'action' function. Data may be buffered internally, for example by the notebook runner logic, until it has input queued up for each of the specified inputs.

Functionally, the contents of the second cell[4] is executed after the contents of the third cell, cell[ ]. When cells are properly factored to start, and any 'input' cells only do input, it may be effective to reorder 'input' cells up above any non-commented cells.

In one embodiment, multiple outputs may be specified together as shown in FIG. 7, wherein the Python code is executed, and then the variables named by the smart comments are emitted to the appropriate stream descriptors.

Model Deploy Example. An example of model deploy (320) in FIG. 3 is a containerized Jupyter notebook server with FastScore's model deployment and Jupyter integration toolkit built-in. It may be built on top of a Jupyter data science Docker image. Model Deploy provides model creation and deployment tools for R and Python notebooks, as well as for PFA.

Start Model Deploy (320) with the following command:
docker run -it --rm -p 8888:8888 fastscore/model-deploy:latest If other services in the FastScore fleet are also running on the same host, it may be advantageous to start Model Deploy with the --net="host" option, so that these services are accessible from localhost. Model Deploy (320) may also be started with any of the additional configuration options available to the Jupyter base Docker image. Once the container is created, it may be accessible from port 8888 (by default) on the host machine, using the token generated during the startup process.

Model Deploy (320) may provide a number of features to make it easy to migrate a model into FastScore:

Python and R supply a Model class that may be used for validation and testing of a model locally, before deploying to a FastScore engine;

The Model.from_string (Python) and Model_from_string (R) functions provide shortcuts for creating a Model object from a string of code. In Python notebooks, the %%py2model, %%py3model, %%pfamodel, and %%ppfamodel cell magic commands may automatically convert the contents of a cell into a Python or (P)PFA model object, respectively;

The Engine class allows for direct interaction with a FastScore Engine, including scoring data using a running Engine;

Model objects may be deployed directly to a FastScore Engine from within the Jupyter notebook, as well as to Model Manager; and A utility codec library may be included to make it easy to serialize R and Python objects to JSON and other formats based on an Avro schema.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a processor configured to:
receive an analytic model generated in a data scientist model acquisition toolbench comprising a computational notebook user interface comprising a cell with code;
display the analytic model in the computational notebook user interface to accept a smart comment within the cell;
translate an analytic model using a structuring tool based at least in part on the smart comment; and
perform an execution simulation for testing the translated analytic model for executing the model in the data scientist model acquisition toolbench; and
a memory coupled to the processor and configured to provide the processor with instructions.

2. The system of claim 1, wherein the processor is further configured to export the translated analytic model for deployment in a production execution environment.

3. The system of claim 1, wherein the processor is further configured to export the translated analytic model to a virtualized execution environment for an analytic engine.

4. The system of claim 1, wherein the structuring tool is integrated into the data scientist model acquisition toolbench.

5. The system of claim 1, wherein the execution simulator is integrated into the data scientist model acquisition toolbench.

6. The system of claim 1, wherein model deploy tools are integrated into the data scientist model acquisition toolbench.

7. The system of claim 1, wherein the processor is further configured to publish to export the analytic model to a model manager.

8. The system of claim 1, wherein the processor is further configured to perform model life cycle tracking.

9. The system of claim 8, wherein performing model life cycle tracking comprises using a graph database for tracking any changes to the model from development through deployment life cycle.

10. The system of claim 1, wherein the processor is further configured to support a plug-in for a second data scientist model acquisition toolbench.

11. The system of claim 1, wherein translating comprises an object-based abstraction of the analytic model.

12. The system of claim 1, wherein the data scientist model acquisition toolbench comprises at least one of the following: Jupyter, Rstudio, Zeppelin, Cloudera, and Data Science Toolbench.

13. The system of claim 1, wherein the data scientist model acquisition toolbench comprises tools for at least one of the following: execution simulation, automatic schema generation, structuring, and test.

14. The system of claim 1, wherein the analytic model is written in at least one of the following: C, Python, Java, R, S, SAS, PFA, H2O, PMML, SPSS, and MATLAB.

15. The system of claim 1, wherein translating includes using reasonable factoring.

16. The system of claim 1, wherein translating includes using the smart comment.

17. The system of claim 1, wherein translating includes using the smart comment for input schema or output schema.

18. The system of claim 1, wherein translating includes using the smart comment for initializing code or ignoring code.

19. A method, comprising:

receiving an analytic model generated in a data scientist model acquisition toolbench comprising a computational notebook user interface comprising a cell with code;

displaying the analytic model in the computational notebook user interface to accept a smart comment within the cell;

translating an analytic model using a structuring tool based at least in part on the smart comment; and performing an execution simulation for testing the translated analytic model for executing the model in the data scientist model acquisition toolbench.

20. A computer program product, the computer program product being embodied in a non-transitory computer readable storage medium and comprising computer instructions for:

receiving an analytic model generated in a data scientist model acquisition toolbench comprising a computational notebook user interface comprising a cell with code;

displaying the analytic model in the computational notebook user interface to accept a smart comment within the cell;

translating an analytic model using a structuring tool based at least in part on the smart comment; and performing an execution simulation for testing the translated analytic model for executing the model in the data scientist model acquisition toolbench.

* * * * *